US008519716B2

(12) United States Patent
Kurata

(10) Patent No.: US 8,519,716 B2
(45) Date of Patent: Aug. 27, 2013

(54) BATTERY PACK, SEMICONDUCTOR INTEGRATED CIRCUIT, REMAINING CAPACITY CORRECTION METHOD, AND STORAGE MEDIUM

(75) Inventor: Koichi Kurata, Tokyo (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 298 days.

(21) Appl. No.: 13/133,768

(22) PCT Filed: Jan. 8, 2010

(86) PCT No.: PCT/JP2010/050178
§ 371 (c)(1),
(2), (4) Date: Jun. 9, 2011

(87) PCT Pub. No.: WO2010/082549
PCT Pub. Date: Jul. 22, 2010

(65) Prior Publication Data
US 2011/0241693 A1   Oct. 6, 2011

(30) Foreign Application Priority Data

Jan. 14, 2009   (JP) .................................. 2009-006087

(51) Int. Cl.
*G01N 27/42*   (2006.01)
(52) U.S. Cl.
USPC ........... 324/427; 324/425; 324/444; 320/118; 320/132; 320/152; 320/162
(58) Field of Classification Search
None
See application file for complete search history.

(56) References Cited

U.S. PATENT DOCUMENTS

| | | | | |
|---|---|---|---|---|
| 6,300,763 B1 * | 10/2001 | Kwok | ........................... | 324/427 |
| 7,705,561 B2 * | 4/2010 | Yano | ............................. | 320/118 |
| 7,791,347 B2 * | 9/2010 | Rajpara et al. | ................ | 324/426 |
| 8,098,048 B2 * | 1/2012 | Hoff | ............................. | 320/120 |

FOREIGN PATENT DOCUMENTS

| | | |
|---|---|---|
| JP | 08-126214 | 5/1996 |
| JP | 2001-281306 | 10/2001 |
| JP | 2002-006011 | 1/2002 |
| JP | 2004-361313 | 12/2004 |

OTHER PUBLICATIONS

International Search Report mailed on Apr. 6, 2010.

* cited by examiner

*Primary Examiner* — Melissa Koval
*Assistant Examiner* — Trung Nguyen
(74) *Attorney, Agent, or Firm* — IPUSA, PLLC

(57) ABSTRACT

A battery pack includes a voltage detection part configured to detect the voltage of a battery unit including multiple chargeable and dischargeable secondary cells; a current detection part configured to detect a current flowing through the battery unit; a dischargeable capacity calculation part configured to calculate the dischargeable capacity of the battery unit based on the current detected by the current detection part; and a capacity correction part configured to correct the remaining capacity of the battery unit, the remaining capacity including the dischargeable capacity calculated by the dischargeable capacity calculation part, wherein the capacity correction part is configured to correct the remaining capacity based on an estimated dischargeable capacity calculated from the relationship between a preset predetermined voltage and the drop rate of the voltage of the battery unit, in response to the voltage of the battery unit becoming less than or equal to a predetermined threshold.

9 Claims, 12 Drawing Sheets

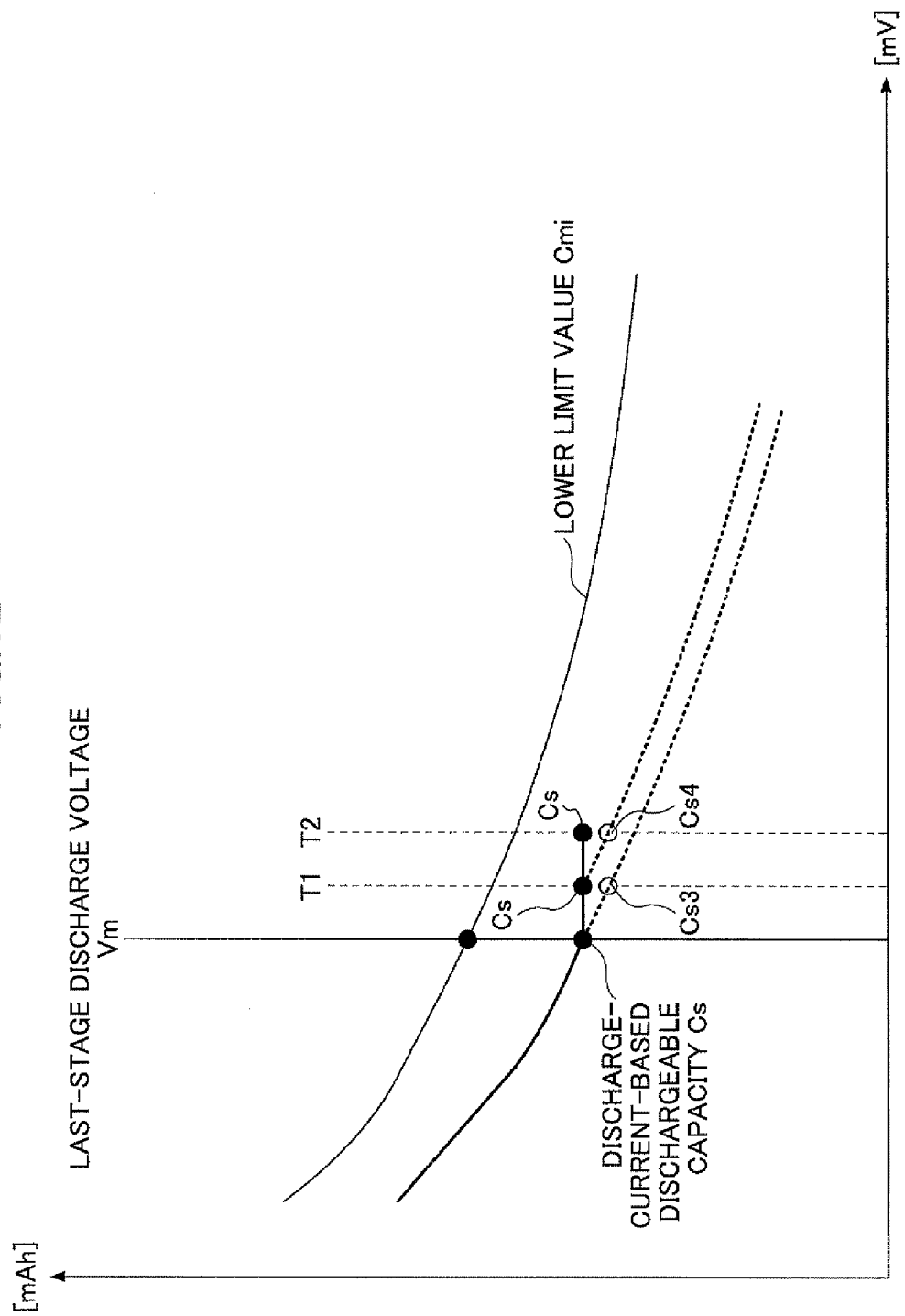

BATTERY PACK, SEMICONDUCTOR INTEGRATED CIRCUIT, REMAINING CAPACITY CORRECTION METHOD, AND STORAGE MEDIUM

TECHNICAL FIELD

The present invention relates to a battery pack formed of multiple chargeable and dischargeable secondary cells, a semiconductor integrated circuit (IC) mounted in this battery pack, a remaining capacity correction method executed by this semiconductor integrated circuit, and a computer-readable storage medium storing a program for causing a computer to execute this remaining capacity correction method.

BACKGROUND ART

In recent years, as electronic apparatuses have become smaller in size, portable devices have been widely used that are driven by a battery pack having a rechargeable battery, which is chargeable and dischargeable. Conventional battery packs built in portable devices have a function of calculating the dischargeable capacity of a rechargeable battery and notifying the portable devices of the dischargeable capacity. In the case of calculating a dischargeable capacity in conventional battery packs, the dischargeable capacity is determined by periodically measuring a discharge current from the rechargeable battery at predetermined intervals and adding up the measured discharge currents.

However, if there is an error in the dischargeable capacity determined by adding up the discharge currents, the dischargeable capacity calculated on the battery pack side may not correspond to a discharge cutoff voltage, which is a minimum voltage necessary to drive the portable device.

In particular, since the rechargeable battery has the voltage characteristic of a sudden voltage drop at the last stage of discharging, the error in the dischargeable capacity increases at the last stage of discharging. Therefore, even if the dischargeable capacity calculated on the battery pack side indicates the capability of causing the portable device to operate, the actual voltage may have reached the discharge cutoff voltage. In this case, the portable device stops operating in response to the rechargeable battery in the battery pack reaching the discharge cutoff voltage. Therefore, the portable device may stop operating when the user least expects it.

Therefore, it has been desired to improve the accuracy of detecting the dischargeable capacity. For example, Patent Document 1 describes a rechargeable battery remaining capacity computing apparatus and method that compute the remaining capacity of a rechargeable battery at the last stage of discharging with accuracy.

PRIOR ART DOCUMENT(S)

Patent Document

[Patent Document 1] Japanese Laid-Open Patent Application No. 2004-361313

SUMMARY OF THE INVENTION

Problems to be Solved by the Invention

The following are two factors of the error caused in the dischargeable capacity determined by adding up discharge currents. The first factor is that since the discharge current of a rechargeable battery varies in accordance with usage conditions, variations in the discharge current caused during a measurement period cannot be measured if the measurement period of the discharge current is long. The second factor is that there are small discharge currents and self discharge that are not added up as discharge currents. The errors caused by the above-described two factors accumulate so that the error at the last stage of discharging may be large.

Means for Solving the Problems

According to one aspect of the present invention, a battery pack includes a voltage detection part configured to detect a voltage of a battery unit including a plurality of chargeable and dischargeable secondary cells; a current detection part configured to detect a current flowing through the battery unit; a dischargeable capacity calculation part configured to calculate a dischargeable capacity of the battery unit based on the current detected by the current detection part; and a capacity correction part configured to correct a remaining capacity of the battery unit, the remaining capacity including the dischargeable capacity calculated by the dischargeable capacity calculation part, wherein the capacity correction part is configured to correct the remaining capacity based on an estimated dischargeable capacity calculated from a relationship between a preset predetermined voltage and a drop rate of the voltage of the battery unit, in response to the voltage of the battery unit becoming less than or equal to a predetermined threshold.

According to one aspect of the present invention, a method of correcting a remaining capacity of a battery unit by a battery pack including the battery unit, the battery unit including a plurality of chargeable and dischargeable secondary cells, includes the steps of detecting a current flowing through the battery unit; detecting a voltage of the battery unit; calculating a dischargeable capacity of the battery unit based on the current detected by the step of detecting the current; and correcting a remaining capacity of the battery unit, the remaining capacity including the dischargeable capacity calculated by the step of calculating the dischargeable capacity, wherein the step of correcting the remaining capacity corrects the remaining capacity based on an estimated dischargeable capacity calculated from a relationship between a preset predetermined voltage and a drop rate of the voltage of the battery unit, in response to the voltage of the battery unit becoming less than or equal to a predetermined threshold.

According to one aspect of the present invention, a computer-readable storage medium stores a program for causing a computer to execute the method of correcting a remaining capacity of a battery unit as set forth above.

According to one aspect of the present invention, a semiconductor integrated circuit includes a voltage detection part configured to detect a voltage of a battery unit including a plurality of chargeable and dischargeable secondary cells; a current detection part configured to detect a current flowing through the battery unit; a dischargeable capacity calculation part configured to calculate a dischargeable capacity of the battery unit based on the current detected by the current detection part; and a capacity correction part configured to correct a remaining capacity of the battery unit, the remaining capacity including the dischargeable capacity calculated by the dischargeable capacity calculation part, wherein the capacity correction part is configured to correct the remaining capacity based on an estimated dischargeable capacity calculated from a relationship between a preset predetermined voltage and a drop rate of the voltage of the battery unit, in response to the voltage of the battery unit becoming less than or equal to a predetermined threshold.

Effects of the Invention

According to one aspect of the present invention, it is possible to reduce an error in the dischargeable capacity of a rechargeable battery at the last stage of discharging and to improve the accuracy of detecting the dischargeable capacity of the rechargeable battery.

BRIEF DESCRIPTION OF THE DRAWINGS

Other objects, features and advantages of the present invention will become more apparent from the following detailed description when read in conjunction with the accompanying drawings, in which:

FIG. 12 is a graph illustrating a second method of correcting the discharge-current-based dischargeable capacity so that the discharge-current-based dischargeable capacity is more than or equal to the lower limit value according to the embodiment of the present invention.

MODE FOR CARRYING OUT THE INVENTION

According to embodiments of the present invention, the dischargeable capacity of a battery unit calculated from its discharge current is corrected based on the estimated dischargeable capacity calculated from the voltage drop rate of the battery unit when the voltage value of the battery unit reaches a last-stage discharge voltage.

A description is given below, with reference to the accompanying drawings, of an embodiment of the present invention.

Figure 1:
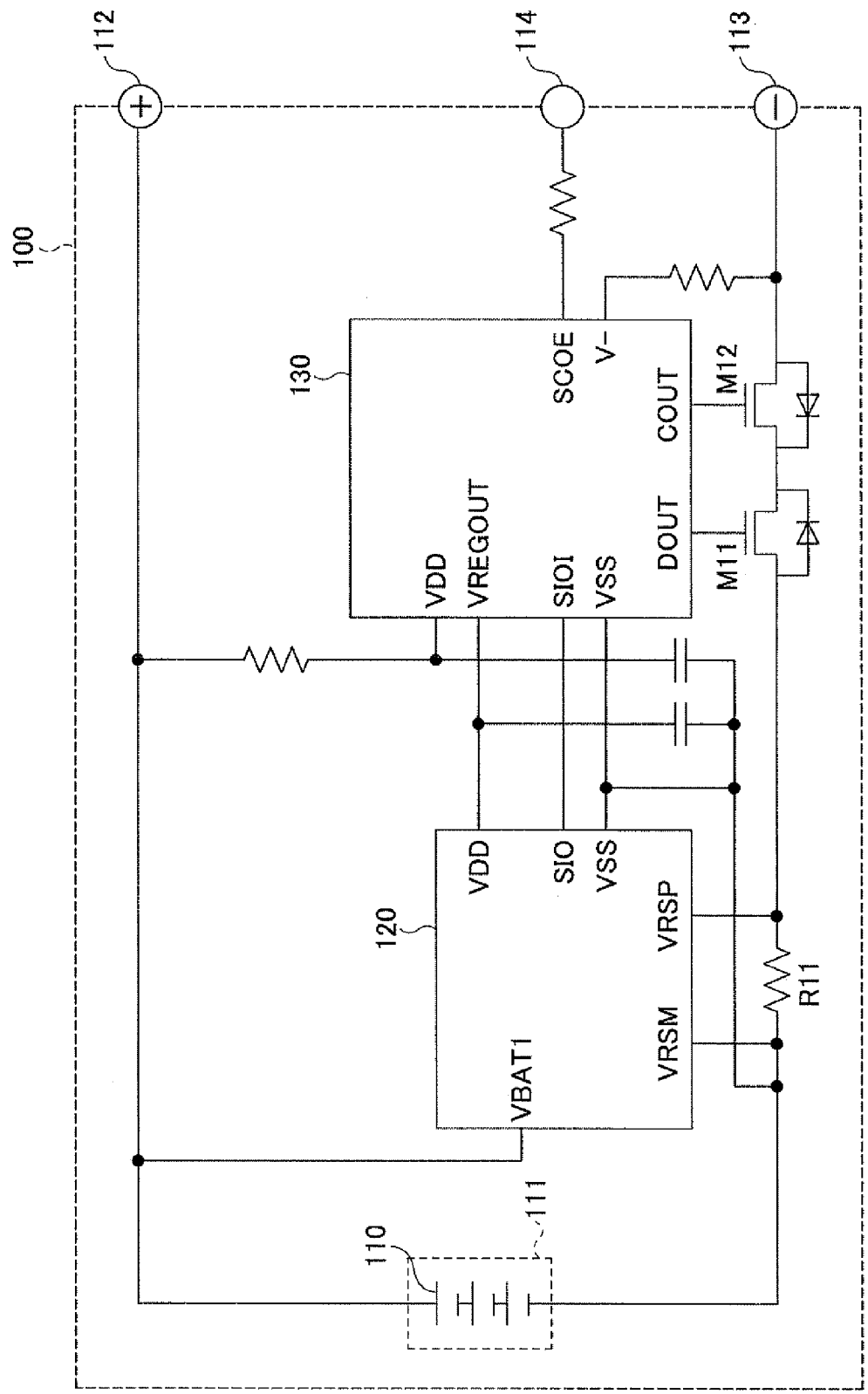
FIG. 1 is a diagram illustrating a battery pack according to an embodiment of the present invention.

FIG. 1 is a diagram illustrating a battery pack 100 according to this embodiment.

The battery pack 100 includes a battery unit 111 having multiple secondary cells 110 such as lithium ion cells connected. According to this embodiment, the battery unit 111 has the secondary cells 110 connected in series, but is not limited to this configuration.

The battery pack 100 includes a positive terminal 112 and a negative terminal 113 for connection to a below-described portable device into which the battery pack 100 is to be incorporated. The battery pack 100 further includes a battery monitoring IC 120 and a protection IC 130 between the positive and negative terminals 112 and 113 and the battery unit 111.

The battery monitoring IC 120 includes a power supply terminal VDD, a reference potential terminal VSS, a voltage detection terminal VBAT1, a pair of current detection terminals VRSP and VRSM, and a communication terminal SIO. The battery monitoring IC 120 is configured to receive a voltage regulated from battery voltage in the protection IC 130 through the power supply terminal VDD. The reference potential terminal VSS is connected to the negative electrode of the battery unit 111.

The battery monitoring IC 120 monitors the status of the battery unit 111. The battery monitoring IC 120 is configured to detect the output voltage of the battery unit 111 through the voltage detection terminal VBAT1 connected to the positive electrode of the battery unit 111. The current detection terminal VRSM is connected to the negative electrode of the battery unit 111 and is connected further to the current detection terminal VRSP through a resistor R11 outside the battery monitoring IC 120.

The battery monitoring IC 120 is configured to detect current flowing through the external resistor R11, that is, the charging/discharge current of the battery unit 111, through the current detection terminals VRSP and VRSM. The communication terminal SIO is connected through the protection IC 130 to an external terminal 114 used for communications with the portable device. The battery monitoring IC 120 is configured to communicate with the portable device through the communication terminal SIO and the protection IC 130. The battery monitoring IC 120 is described in detail below.

The protection IC 130 includes a terminal DOUT and a terminal COUT that are connected to the gates of MOS transistors M11 and M12, respectively, that interrupt the charging and discharging of the battery pack 100. The protection IC 130 turns OFF the MOS transistor M11 by causing the output level of the terminal DOUT to be LOW in response to detection of an overdischarge or overcurrent, and turns OFF the MOS transistor M12 by causing the output level of the terminal COUT to be LOW in response to detection of an overcharge in an overcharge detection circuit.

Figure 2:
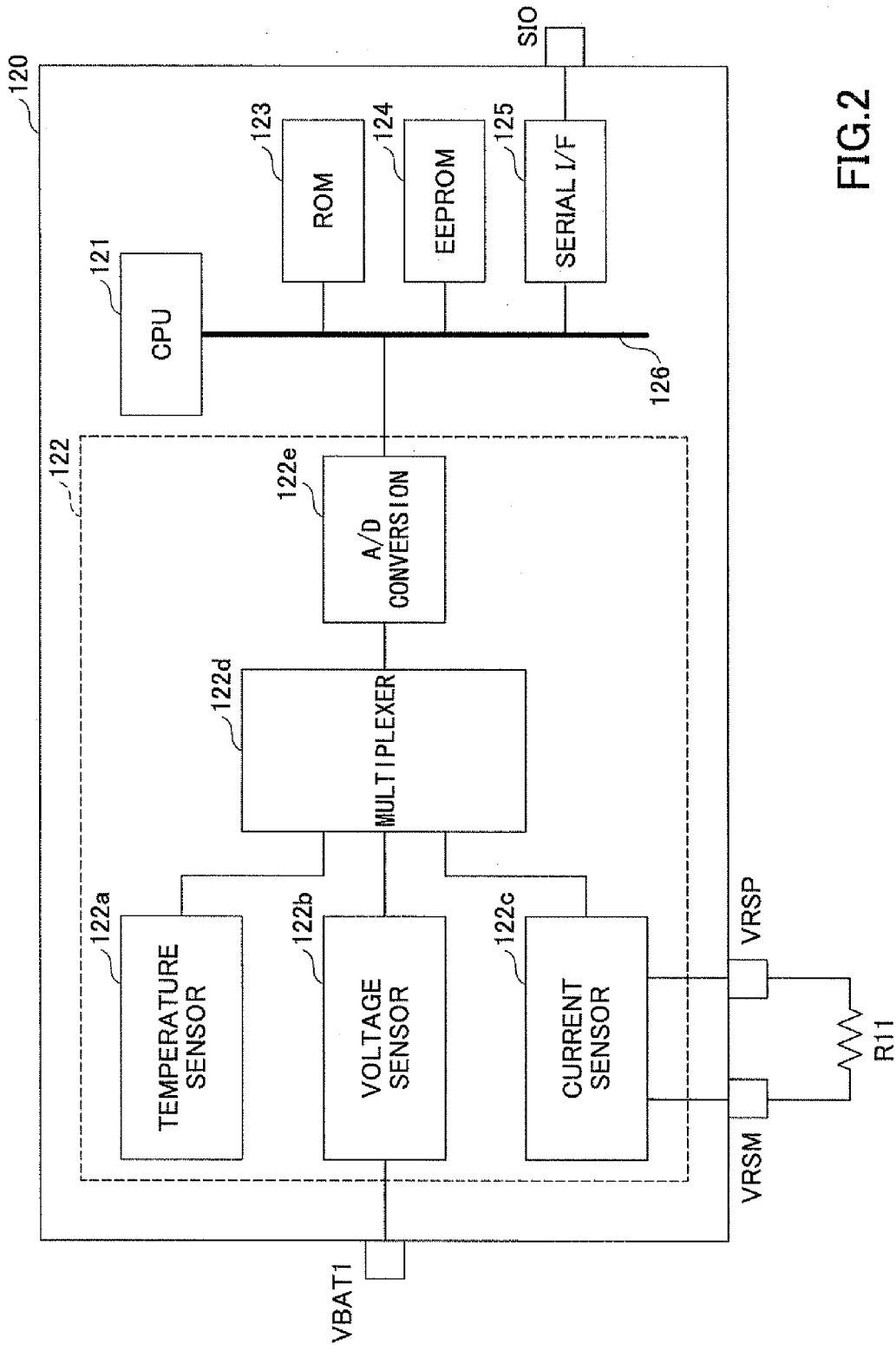
FIG. 2 is a diagram illustrating a hardware configuration of a battery monitoring IC according to the embodiment of the present invention.

FIG. 2 is a diagram illustrating a hardware configuration of the battery monitoring IC 120 according to this embodiment. Referring to FIG. 2, the battery monitoring IC 120 includes a CPU (Central Processing Unit) 121, a sensor part 122, a ROM (read-only memory) 123 (a storage medium), an EEPROM (electrically erasable programmable ROM) 124, and a serial interface (I/F) 125.

The CPU 121 is configured to control the parts of the battery monitoring IC 120. The sensor part 122 is configured to detect the voltage, current, and temperature of the battery unit 111 (see FIG. 1). The ROM 123 is configured to store a program executed by the CPU 121 to control the parts of the battery monitoring IC 120. The EEPROM 124 is configured to store information such as the parameters of the voltage, current, and temperature of the battery unit 111 detected by the sensor part 122 and an authentication ID for authentication between the battery pack 100 and the portable device. The serial I/F 125 is configured to communicate with the portable device through the communication terminal SIO. The CPU 121, the sensor part 122, the ROM 123, the EEPROM 124, and the serial I/F 125 are connected through a bus 126 so as to exchange data and programs among them.

The sensor part 122 includes a temperature sensor circuit 122a, a voltage sensor circuit 122b, a current sensor circuit 122c, a multiplexer 122d, and an analog-to-digital (A/D) conversion circuit 122e.

The temperature sensor circuit 122a detects the temperature of the battery unit 111. The voltage sensor circuit 122b detects the output voltage of the battery unit 111 through the voltage detection terminal VBAT1 connected to the battery unit 111. The current sensor circuit 122c detects current flowing through the external resistor R11, that is, the charging/discharge current of the battery unit 111, through the current detection terminals VRSP and VRSM. The outputs of the temperature sensor circuit 122a, the voltage sensor circuit 122b, and the current sensor circuit 122c are connected (input) to the multiplexer 122d to be output as a single signal by the multiplexer 122d. The A/D conversion circuit 122e converts the output signal of the multiplexer 122d from analog to digital.

Figure 3:
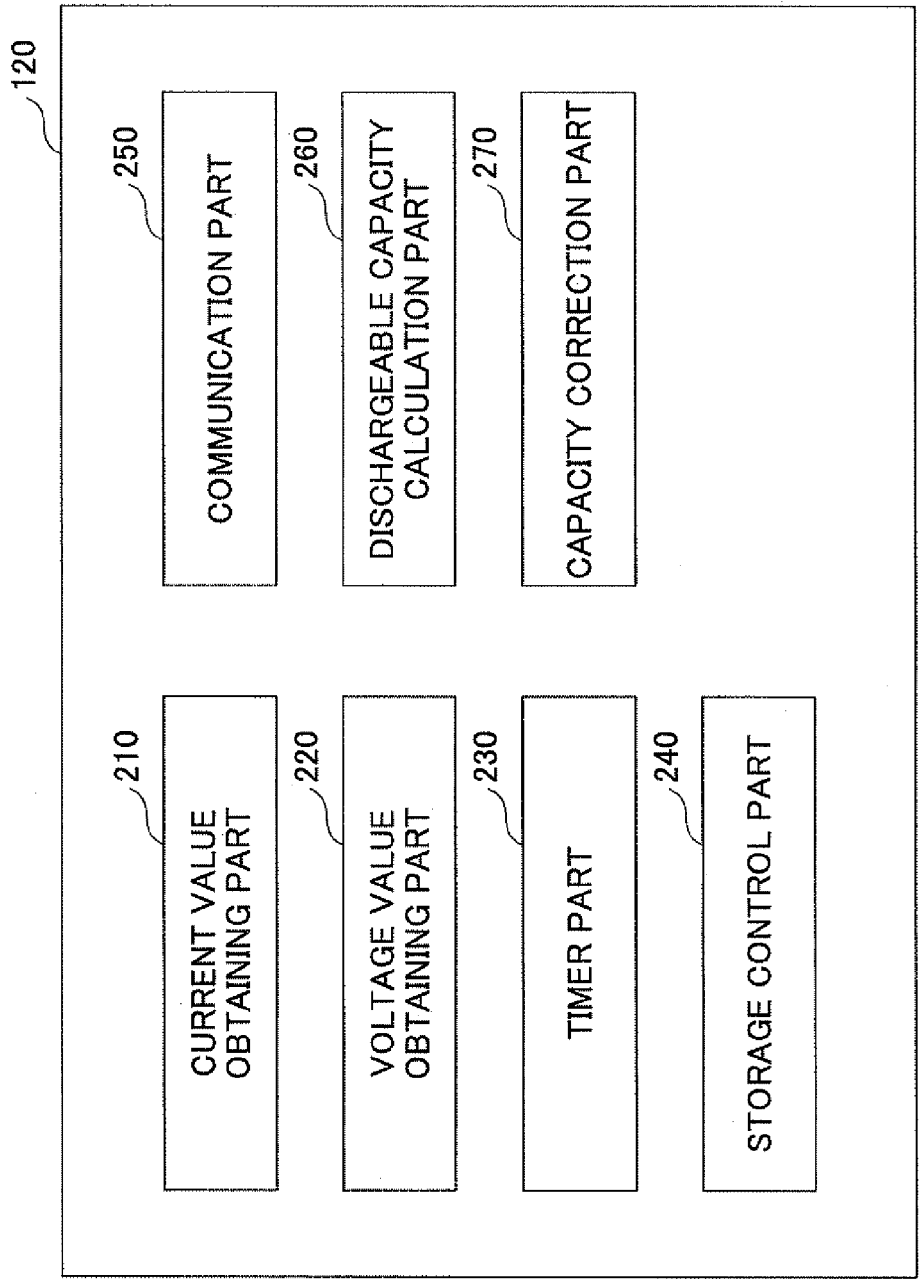
FIG. 3 is a block diagram illustrating a functional configuration of the battery monitoring IC according to the embodiment of the present invention.

FIG. 3 is a block diagram illustrating a functional configuration of the battery monitoring IC 120 according to this embodiment. In this embodiment, the functional configuration of the battery monitoring IC 120 illustrated in FIG. 3 is embodied by a particular program contained in the ROM 123 illustrated in FIG. 2. In other embodiments, a hardware module that embodies such a functional configuration may be provided separately from other elements in the hardware configuration of FIG. 2.

The battery monitoring IC 120 includes a current value obtaining part 210, a voltage value obtaining part 220, a timer part 230, a storage control part 240, a communication part 250, a dischargeable capacity calculation part 260, and a capacity correction part 270.

The current value obtaining part 210 obtains the current value detected by the current sensor circuit 122c. The voltage value obtaining part 220 obtains the voltage value detected by the voltage sensor circuit 122b. The timer part 230 measures time with a built-in clock function of the battery monitoring IC 120. The storage control part 240 stores the current value obtained by the current value obtaining part 210, the voltage value obtained by the voltage value obtaining part 220, the dischargeable capacity calculated by the dischargeable capacity calculation part 260, etc., in, for example, the EEPROM 124. The communication part 250 performs communications with the portable device in which the battery pack 100 is to be contained.

The dischargeable capacity calculation part 260 calculates the dischargeable current of the battery unit 111 from the discharge current of the battery unit 111 based on the current value obtained by the current value obtaining part 210. In the following description of this embodiment, the dischargeable capacity calculated (based on added-up discharge currents) by the dischargeable capacity calculation part 260 is referred to as a discharge-current-based dischargeable capacity Cs. The capacity correction part 270 corrects the remaining capacity of the battery unit 111 by correcting the discharge-current-based dischargeable capacity Cs by the processing described below.

Figure 4:
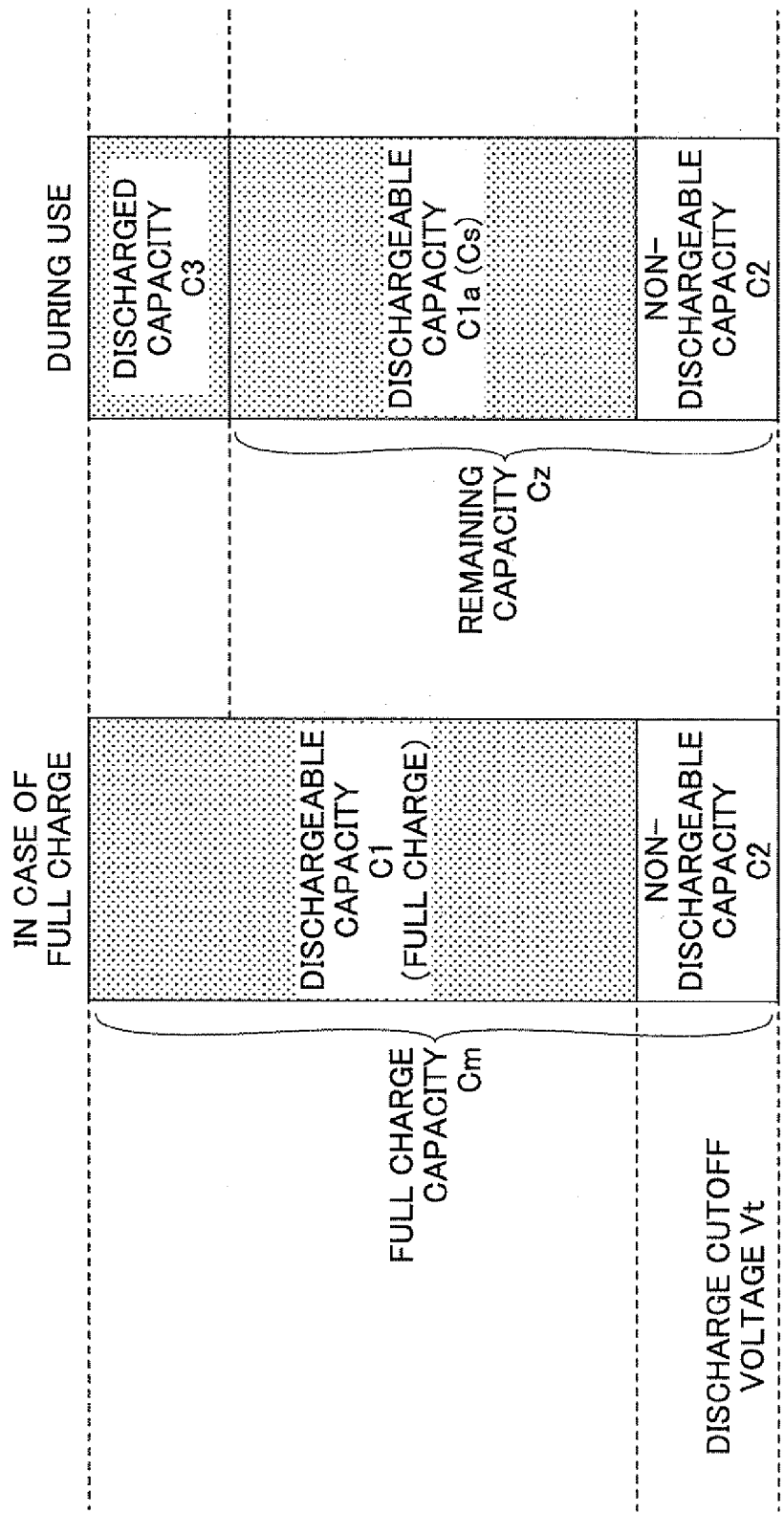
FIG. 4 is a diagram for illustrating a dischargeable capacity and a remaining capacity according to the embodiment of the present invention.

Here, a description is given of the dischargeable capacity and the remaining capacity of the battery unit 111 according to this embodiment. FIG. 4 is a diagram for illustrating the dischargeable capacity and the remaining capacity according to this embodiment.

A full-charge capacity Cm of the battery unit 111 of this embodiment is indicated by the sum of a dischargeable capacity C1 and a non-dischargeable capacity C2. The dischargeable capacity C1 is a capacity that is dischargeable (available for discharge), that is, the amount of stored energy that may be discharged, determined by discharge conditions such as temperature and the magnitude of discharge current. The non-dischargeable capacity C2 is a capacity that is not dischargeable (unavailable for discharge), that is, the amount of stored energy that may not be released (discharged) from the battery unit 111, determined by discharge conditions such as temperature and the magnitude of discharge current.

A remaining capacity Cz of the battery unit 111 of this embodiment is indicated by the capacity obtained by subtracting a used capacity (hereinafter, "discharged capacity C3) from the full-charge capacity Cm. For example, as illustrated in FIG. 4, when the discharged capacity C3 is subtracted from the full-charge capacity Cm, the dischargeable capacity C1 becomes a capacity C1a. Therefore, the remaining capacity Cz of this embodiment at this point is the sum of the current dischargeable capacity C1a and the non-dischargeable capacity C2.

The dischargeable capacity calculation part 260 of this embodiment calculates a capacity corresponding to the dischargeable capacity C1a as the discharge-current-based dischargeable capacity Cs.

The capacity correction part 270 of this embodiment corrects the remaining capacity Cz of the battery unit 111 so that a discharge cutoff voltage Vt corresponds to the dischargeable capacity C1a with respect to the voltage of the battery unit 111. The discharge cutoff voltage Vt is a minimum voltage necessary to drive the portable device in which the battery pack 100 is mounted.

If the voltage of the battery unit 111 becomes lower than the discharge cutoff voltage Vt, the portable device stops operating without a supply of voltage necessary for its driving. Therefore, the capacity correction part 270 of this embodiment corrects the remaining capacity Cz of the battery unit 111 by correcting the discharge-current-based dischargeable capacity Cs so that the dischargeable capacity C1a becomes zero when the voltage of the battery unit 111 equals the discharge cutoff voltage Vt.

A description is given below of the capacity correction part 270 of this embodiment.

Figure 5:
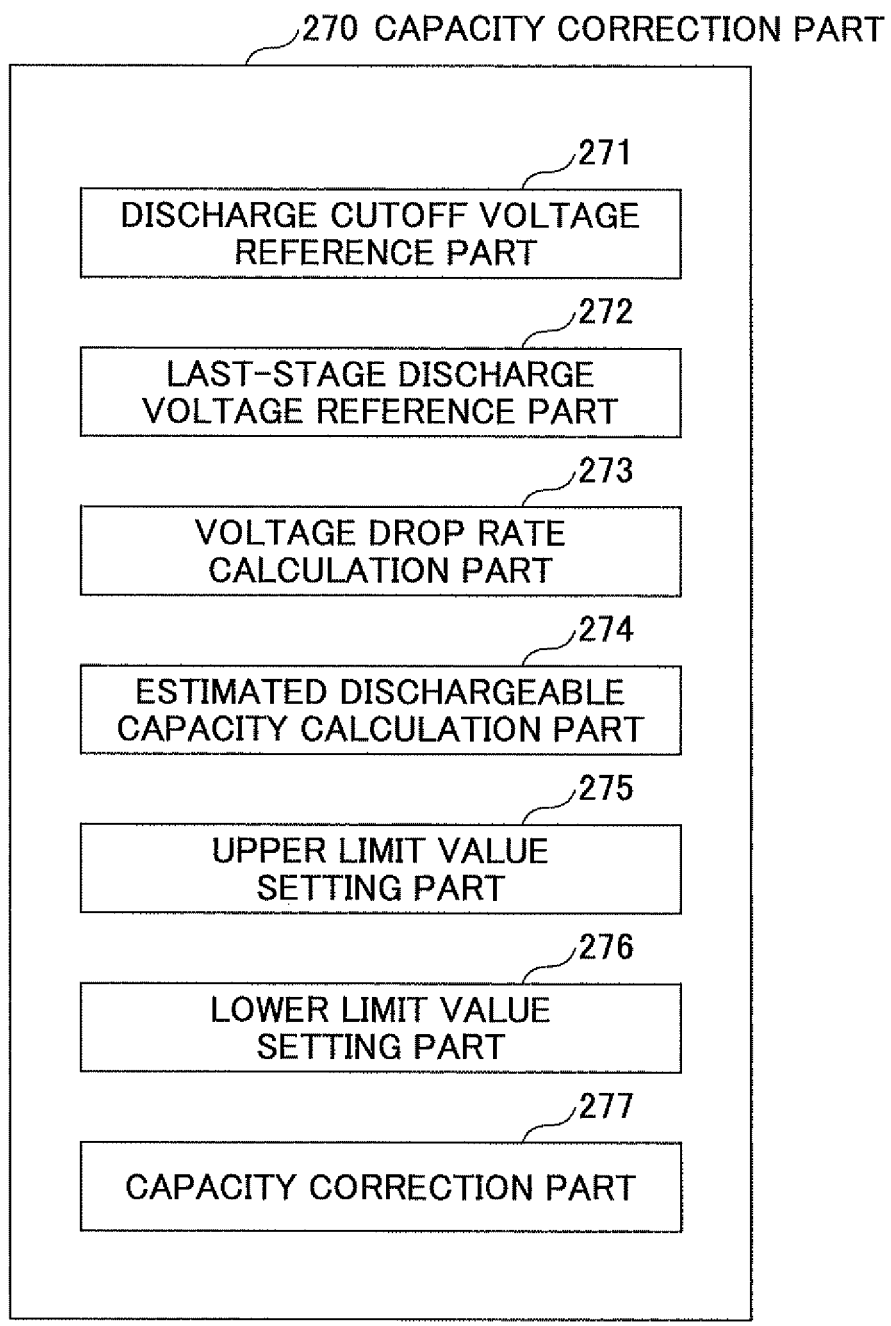
FIG. 5 is a diagram illustrating a functional configuration of a capacity correction part according to the embodiment of the present invention.

FIG. 5 is a diagram illustrating a functional configuration of the capacity correction part 270 of this embodiment. The capacity correction part 270 of this embodiment includes a discharge cutoff voltage reference part 271, a last-stage discharge voltage reference part 272, a voltage drop rate calculation part 273, an estimated dischargeable capacity calculation part 274, an upper limit value setting part 275, a lower limit value setting part 276, and a capacity comparison part 277.

The discharge cutoff voltage reference part 271 refers to the discharge cutoff voltage Vt preset in the battery monitoring IC 120. The discharge cutoff voltage Vt is pre-determined by the specifications of the portable device in which the battery pack 100 is to be mounted. The discharge cutoff voltage Vt may be pre-written in the EEPROM 124 (FIG. 2)

of the battery monitoring IC 120, for example. Alternatively, the communication part 250 (FIG. 3) of the battery monitoring IC 120 may communicate with the portable device when the battery pack 100 is connected to the portable device, so as to obtain the discharge cutoff voltage Vt set in the portable device and write the obtained discharge cutoff voltage Vt into the EEPROM 124.

The last-stage discharge voltage reference part 272 refers to a last-stage discharge voltage Vm preset in the battery monitoring IC 120. It is assumed that the last-stage discharge voltage Vm is pre-determined based on the discharge cutoff voltage Vt and the below-described voltage-dischargeable capacity characteristic of the battery unit 111 and written in the EEPROM 124.

The voltage drop rate calculation part 273 calculates the voltage drop rate of the battery unit 111 based on the voltage-dischargeable capacity characteristic of the battery unit 111 in response to the voltage of the battery unit 111 becoming lower than or equal to the last-stage discharge voltage Vm. The estimated dischargeable capacity calculation part 274 calculates an estimated dischargeable capacity Ct based on the voltage drop rate calculated by the voltage drop rate calculation part 273 and the discharge cutoff voltage Vt. A description is given below, with reference to FIG. 6 and FIG. 7, of the calculation of the voltage drop rate and the calculation of the estimated dischargeable capacity Ct.

Figure 6:
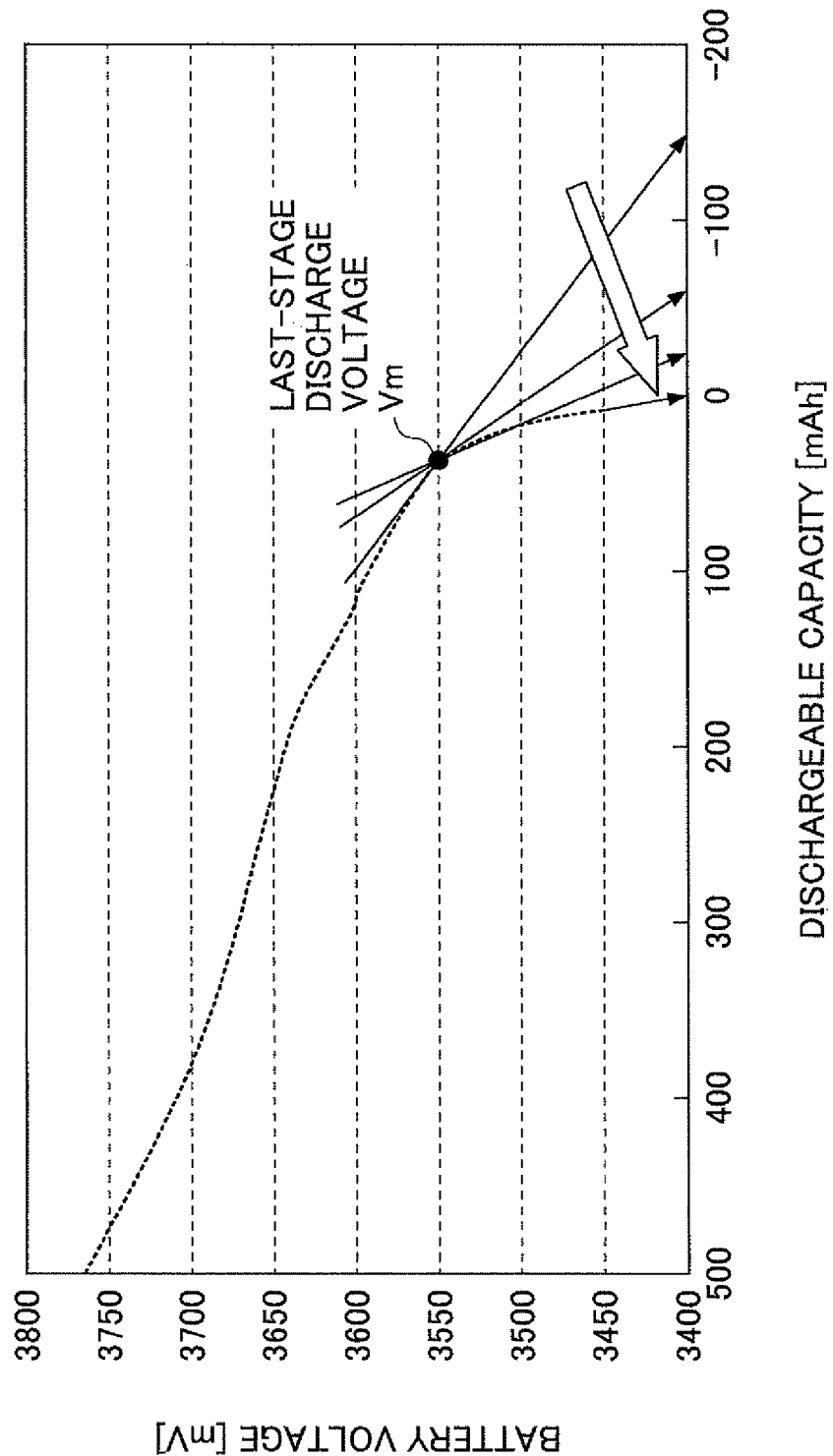
FIG. 6 is a graph illustrating the voltage-dischargeable capacity characteristic of a battery unit according to the embodiment of the present invention.

FIG. 6 is a graph illustrating the voltage-dischargeable capacity characteristic of the battery unit 111. As illustrated in FIG. 6, the voltage of the battery unit 111 of this embodiment drops sharply when becoming lower than or equal to the last-stage discharge voltage Vm. FIG. 6 illustrates a voltage-dischargeable capacity characteristic with a discharge of 300 mA at a battery unit 111 ambient temperature of 25° C. According to this embodiment, the calculation of the voltage drop rate is started in response to the voltage of the battery unit 111 becoming lower than or equal to the last-stage discharge voltage Vm.

Figure 7:
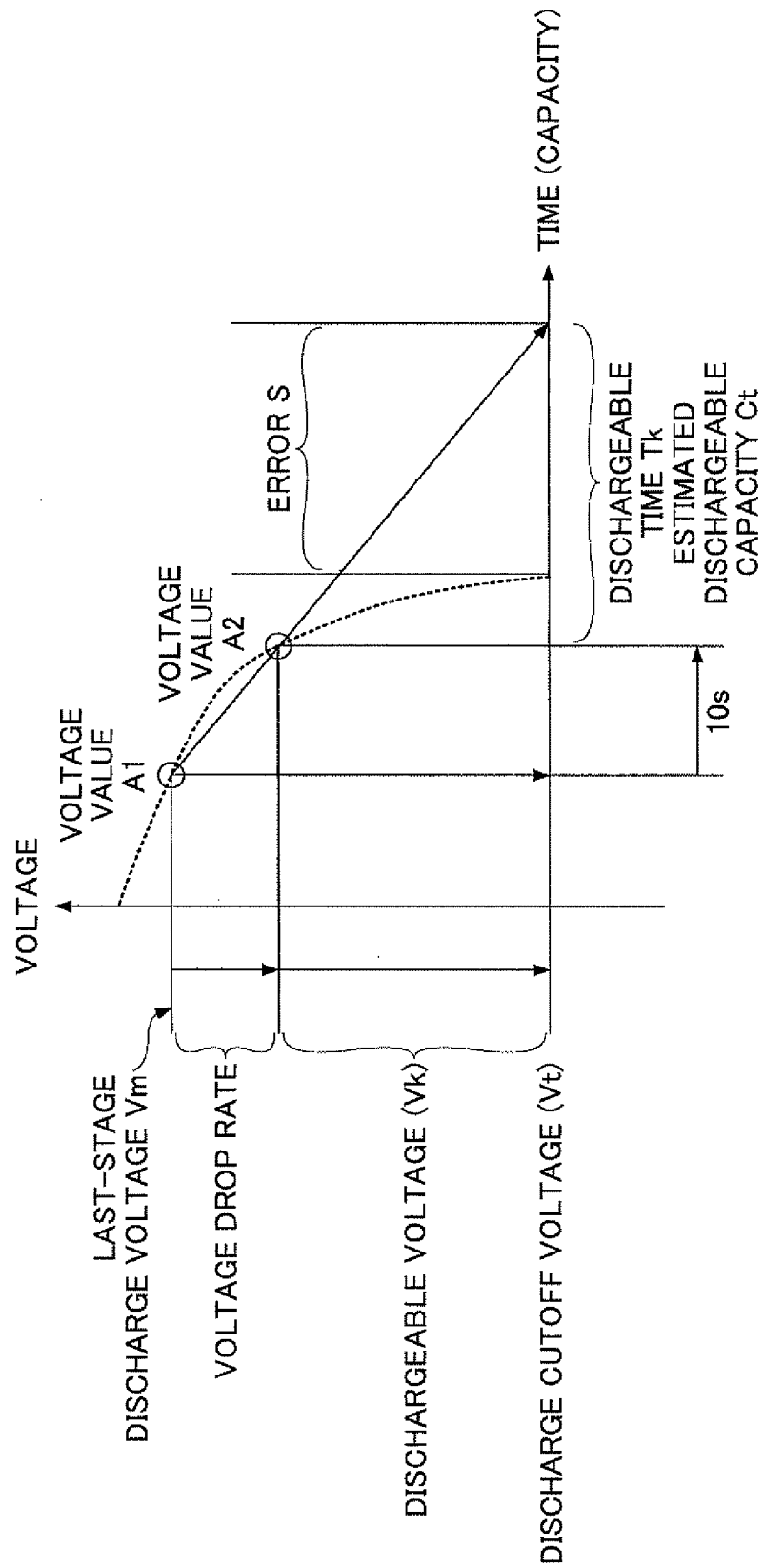
FIG. 7 is a graph for illustrating the calculation of a voltage drop rate and the calculation of an estimated dischargeable capacity according to the embodiment of the present invention.

FIG. 7 is a graph for illustrating the calculation of the voltage drop rate and the calculation of the estimated dischargeable capacity Ct.

The voltage drop rate calculation part 273 of this embodiment starts calculating the voltage drop rate in response to the voltage value obtained by the voltage value obtaining part 220 becoming lower than or equal to the last-stage discharge voltage Vm. According to this embodiment, the voltage drop rate calculation part 273 may monitor the voltage value obtained by the voltage value obtaining part 220. Alternatively, according to this embodiment, the voltage value obtaining part 220 may notify the voltage drop rate calculation part 273 of the voltage value obtained by the voltage value obtaining part 220 in response to the obtained voltage value being lower than or equal to the last-stage discharge voltage Vm.

The voltage drop rate calculation part 273 measures the voltage of the battery unit 111 that is being discharged for a predetermined period of time with the voltage value obtaining part 220, and calculates the voltage drop rate. According to this embodiment, the predetermined period of time may be 10 seconds, for example. In the case of a predetermined period of time of 10 seconds, the voltage drop rate is calculated by (a voltage value A1 of the battery unit 111 10 seconds earlier–a current voltage value A2 of the battery unit 111)/a predetermined period of time (10 seconds).

Next, a description is given of the calculation of the estimated dischargeable capacity Ct by the estimated dischargeable capacity calculation part 274 of this embodiment.

Once the voltage drop rate is calculated, the estimated dischargeable capacity calculation part 274 refers to the discharge cutoff voltage Vt with the discharge cutoff voltage reference part 271, and calculates a dischargeable voltage Vk between a current voltage value and the discharge cutoff voltage Vt. The dischargeable voltage Vk is calculated by (the current voltage value A2 of the battery unit 111—the discharge cutoff voltage Vt).

Next, the estimated dischargeable capacity calculation part 274 calculates a dischargeable time Tk (an estimated discharge time) from the dischargeable voltage Vk and the voltage drop rate. The dischargeable time Tk is calculated by dividing the dischargeable voltage Vk by the voltage drop rate. Once the dischargeable time Tk is calculated, the estimated dischargeable capacity calculation part 274 calculates the estimated dischargeable capacity Ct from the dischargeable time Tk and a current value. The estimated dischargeable capacity Ct is determined by the dischargeable time Tk×a current value.

According to this embodiment, the processing by the voltage drop rate calculation part 273 and the estimated dischargeable capacity calculation part 274 is performed at predetermined intervals until the voltage of the battery unit 111 equals the discharge cutoff voltage Vt. As a result of calculating the estimated dischargeable capacity Ct based on the voltage drop rate at predetermined intervals, an error S between the estimated dischargeable capacity Ct and the dischargeable capacity based on the voltage-dischargeable capacity characteristic (indicated by a broken line in FIG. 7) decreases as the voltage of the battery unit 111 approaches the discharge cutoff voltage Vt. Accordingly, in this embodiment, when the voltage of the battery unit 111 equals the discharge cutoff voltage Vt, the estimated dischargeable capacity Ct becomes zero.

Referring back to FIG. 5, a description is given of the upper limit value setting part 275.

The upper limit value setting part 275 of this embodiment sets the estimated dischargeable capacity Ct calculated by the estimated dischargeable capacity calculation part 274 as an upper limit value Cma of the dischargeable capacity at that point. According to this embodiment, the estimated dischargeable capacity Ct is calculated so as to converge on the voltage-dischargeable capacity characteristic as the voltage of the battery unit 111 decreases from the last-stage discharge voltage Vm to the discharge cutoff voltage Vt. Therefore, the estimated dischargeable capacity Ct may be determined as the upper limit value Cma of the dischargeable capacity.

The lower limit value setting part 276 calculates and sets a lower limit value Cmi of the dischargeable capacity based on the estimated dischargeable capacity Ct. According to this embodiment, the lower limit value setting part 276 sets the product of the estimated dischargeable capacity Ct and a predetermined value as the lower limit value Cmi. The lower limit value Cmi of the dischargeable capacity is determined so that a curve indicating the voltage-dischargeable capacity characteristic is contained between the upper limit value Cma and the lower limit value Cmi and that the lower limit value Cmi is zero when the voltage of the battery unit 111 equals the discharge cutoff voltage Vt. According to this embodiment, the predetermined value by which the estimated dischargeable capacity Ct is multiplied is 0.4. Accordingly, the lower limit value setting part 276 sets the product of the estimated dischargeable capacity Ct and 0.4 as the lower limit value Cmi. This value of 0.4 (40%) is the result of a calculation based on typical discharge conditions, which are a combination of, for example, one of discharge currents of 400 mA, 300 mA, and 0.2 CmA (174 mA, 160 mA, etc.), one of environmental temperatures of 50° C., 25° C., and 0° C., and one of capacity retention rates of 100%, 80%, and 60%. With respect to the capacity retention rate, 100% corresponds to a new product, and 60% indicates a capacity degraded by 40% compared with that of a new product.

The capacity comparison part 277 compares the discharge-current-based dischargeable capacity Cs calculated by the dischargeable capacity calculation part 260 with the upper limit value Cma or the lower limit value Cmi.

The capacity correction part 270 of this embodiment corrects the discharge-current-based dischargeable capacity Cs based on the result of the comparison by the capacity comparison part 277 so that the discharge-current-based dischargeable capacity Cs is between the upper limit value Cma and the lower limit value Cmi of the dischargeable capacity. The correction by the capacity correction part 270 is described in detail below.

Figure 8:
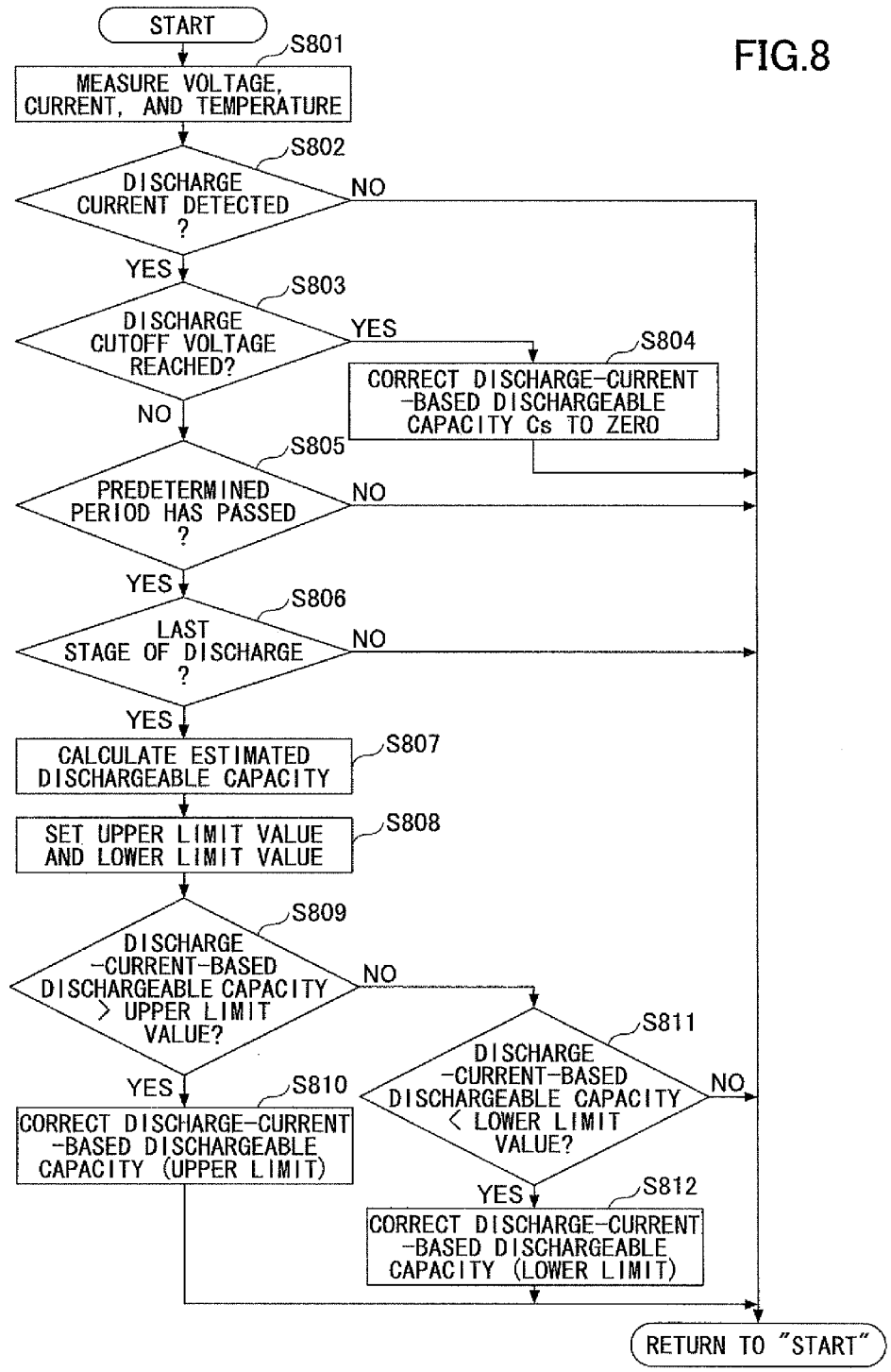
FIG. 8 is a flowchart illustrating operations of the battery monitoring IC according to the embodiment of the present invention.

Next, a description is given of operations of the battery monitoring IC 120 of this embodiment. FIG. 8 is a flowchart illustrating operations of the battery monitoring IC 120 of this embodiment.

The battery monitoring IC 120 of this embodiment monitors the voltage of the battery unit 111, and in step S801, measures the current, voltage, and temperature of the battery unit 111 with the current value obtaining part 210, the voltage value obtaining part 220, and the temperature sensor 122a, respectively. It is assumed that the battery monitoring IC 120 of this embodiment measures the current, voltage, and temperature of the battery unit 111 periodically at predetermined intervals.

In step S802, the battery monitoring IC 120 determines whether a discharge current from the battery unit 111 has been detected by the current value obtaining part 210. If no discharge current is detected in step S802, the battery monitoring IC 120 determines that no discharging is performed by the battery unit 111, and returns to step S801.

If a discharge current has been detected in step S802, in step S803, the battery monitoring IC 120 determines whether the voltage of the battery unit 111 has reached the discharge cutoff voltage Vt.

For example, in the case of discharging with high current or in the case of a large internal resistance of the secondary cells 110, the voltage of the battery unit 111 may reach the discharge cutoff voltage Vt while waiting for a predetermined period of time to pass for calculating the estimated dischargeable capacity Ct in step S805 described below. In this case, even if the discharge-current-based dischargeable capacity Cs is gradually corrected by the processing of steps S807 through S812 described below, the voltage of the battery unit 111 reaches the discharge cutoff voltage Vt before completion of the correction of the discharge-current-based dischargeable capacity Cs.

In this case, when a voltage value is obtained at the next measurement time, the voltage value of the battery unit 111 has reached the discharge cutoff voltage. Therefore, the dischargeable capacity at this point should be zero.

Therefore, if the voltage of the battery unit 111 has reached the discharge cutoff voltage Vt in step S803 (YES in step S803), in step 804, the discharge-current-based dischargeable capacity Cs at this point is considered as an error in the dischargeable capacity, and the dischargeable capacity is corrected to zero.

A description is given below, with reference again to FIG. 4, of the correction in step S804.

It is desired that when the voltage of the battery unit 111 reaches the discharge cutoff voltage Vt, the calculated dischargeable capacity C1a (Cs) be zero and the remaining capacity Cz of the battery unit 111 be equal to the non-dischargeable capacity C2. However, if there is an error in the discharge-current-based dischargeable capacity Cs, the remaining capacity Cz does not equal the non-dischargeable capacity C2. Accordingly, in step S804, the calculated dischargeable capacity C1a is considered as an error, and the calculated dischargeable capacity C1a is corrected to zero.

Referring back to FIG. 8, the battery monitoring IC 120 returns to the processing of step S801 when completing the processing of step S804.

If it is determined in step S803 that the estimated dischargeable capacity Ct may be calculated (NO in step S803), in step S805, the capacity correction part 270 determines whether a predetermined period of time set for calculating the voltage drop rate of the battery unit 111 has passed. If a predetermined period of time has passed in step S805 (YES in step S805), in step S806, the capacity correction part 270 determines whether the voltage value obtained by the voltage value obtaining part 220 has reached the last-stage discharge voltage Vm, referring to the last-stage discharge voltage Vm set by the last-stage discharge voltage reference part 272.

If the voltage value obtained by the voltage value obtaining part 220 has reached the last-stage discharge voltage Vm (YES in step S806), in step S807, the capacity correction part 270 calculates the voltage drop rate with the voltage drop rate calculation part 273, and calculates the estimated dischargeable capacity Ct with the estimated dischargeable capacity calculation part 274.

Next, in step S808, the capacity correction part 270 sets the calculated estimated dischargeable capacity Ct as the upper limit value Cma of the discharge-current-based dischargeable capacity Cs with the upper limit value setting part 275. Further, the capacity correction part 270 sets the product of the estimated dischargeable capacity Ct and 0.4 as the lower limit value Cmi of the discharge-current-based dischargeable capacity Cs with the lower limit value setting part 276.

Next, in step S809, the capacity correction part 270 compares the discharge-current-based dischargeable capacity Cs and the upper limit value Cma with the capacity comparison part 277, and determines whether the discharge-current-based dischargeable capacity Cs is greater than the upper limit value Cma. If the discharge-current-based dischargeable capacity Cs is greater than the upper limit value Cma in step S809 (YES in step S809), in step S810, the capacity correction part 270 corrects the discharge-current-based dischargeable capacity Cs by the method described below so that the discharge-current-based dischargeable capacity Cs is less than or equal to the upper limit value Cma.

If the discharge-current-based dischargeable capacity Cs is not greater than the upper limit value Cma in step S809 (NO in step S809), in step S811, the capacity comparison part 277 compares the discharge-current-based dischargeable capacity Cs and the lower limit value Cmi with the capacity comparison part 277, and determines whether the discharge-current-based dischargeable capacity Cs is less than the lower limit value Cmi. If the discharge-current-based dischargeable capacity Cs is less than the lower limit value Cmi in step S811 (YES in step S811), in step S812, the capacity correction part 270 corrects the discharge-current-based dischargeable capacity Cs by the method described below so that the discharge-current-based dischargeable capacity Cs is greater than or equal to the lower limit value Cmi.

Upon completion of the processing up to step S812, the battery monitoring IC 120 repeats the processing from step S801. According to this embodiment, the capacity correction part 270 performs no correction if the discharge-current-based dischargeable capacity Cs is less than or equal to the upper limit value Cma and greater than or equal to the lower limit value Cmi (NO in step S811).

Figure 9:
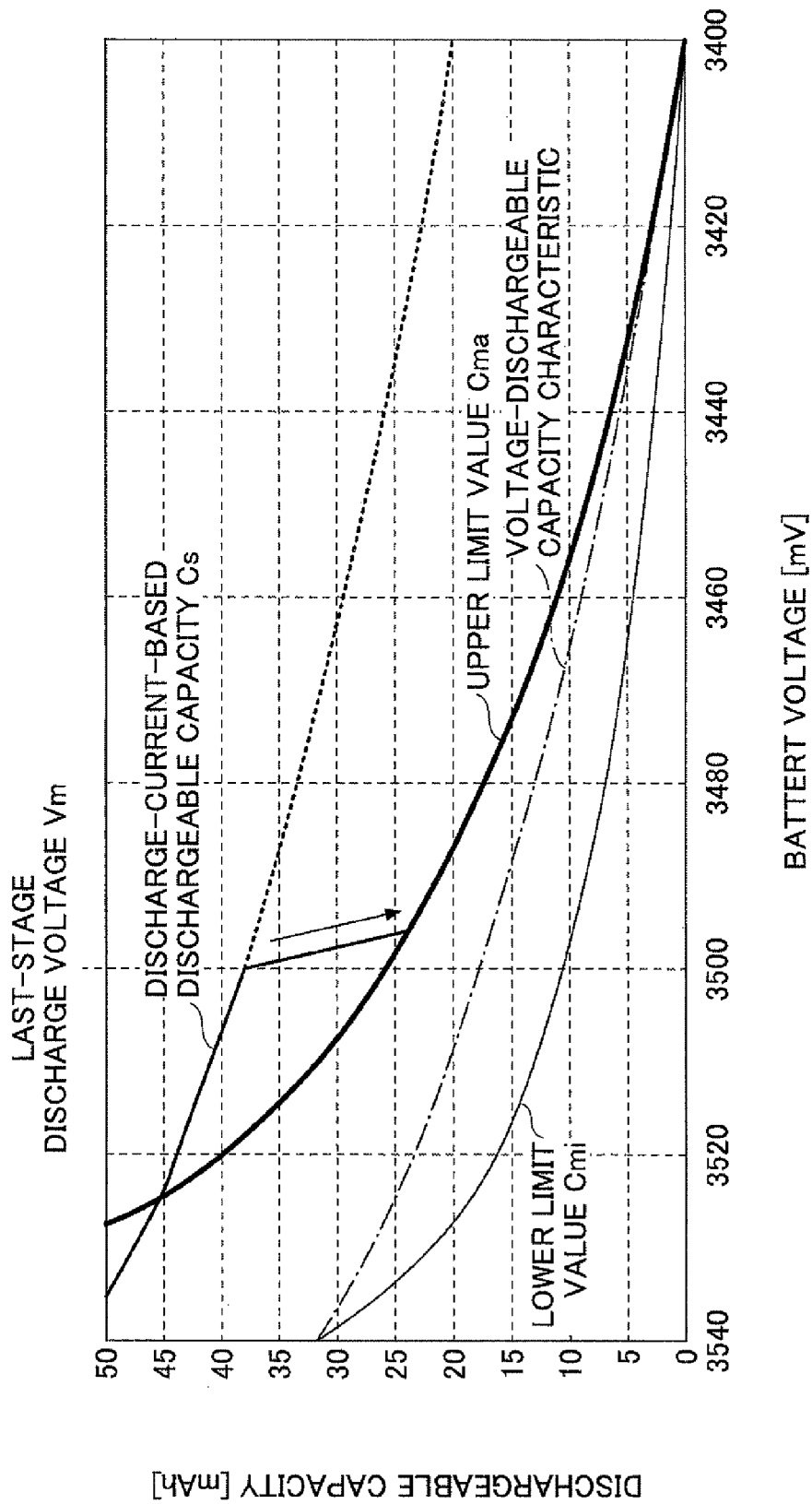
FIG. 9 is a graph illustrating a first method of correcting a discharge-current-based dischargeable capacity so that the discharge-current-based dischargeable capacity is less than or equal to an upper limit value according to the embodiment of the present invention.

A description is given below of the method of correcting the discharge-current-based dischargeable capacity Cs by the capacity correction part 270. First, a description is given, with reference to FIG. 9 and FIG. 10, of correcting the discharge-current-based dischargeable capacity Cs so that the discharge-current-based dischargeable capacity Cs is less than or equal to the upper limit value Cma. FIG. 9 is a graph illustrating a first method of correcting the discharge-current-based dischargeable capacity Cs so that the discharge-current-based dischargeable capacity Cs is less than or equal to the upper limit value Cma.

As illustrated in FIG. 9, when the voltage value of the battery unit 111 reaches the last-stage discharge voltage Vm, the capacity correction part 270 of this embodiment corrects the discharge-current-based dischargeable capacity Cs so that the discharge-current-based dischargeable capacity Cs is less than or equal to the upper limit value Cma if the discharge-current-based dischargeable capacity Cs is greater than the upper limit value Cma.

Figure 10:
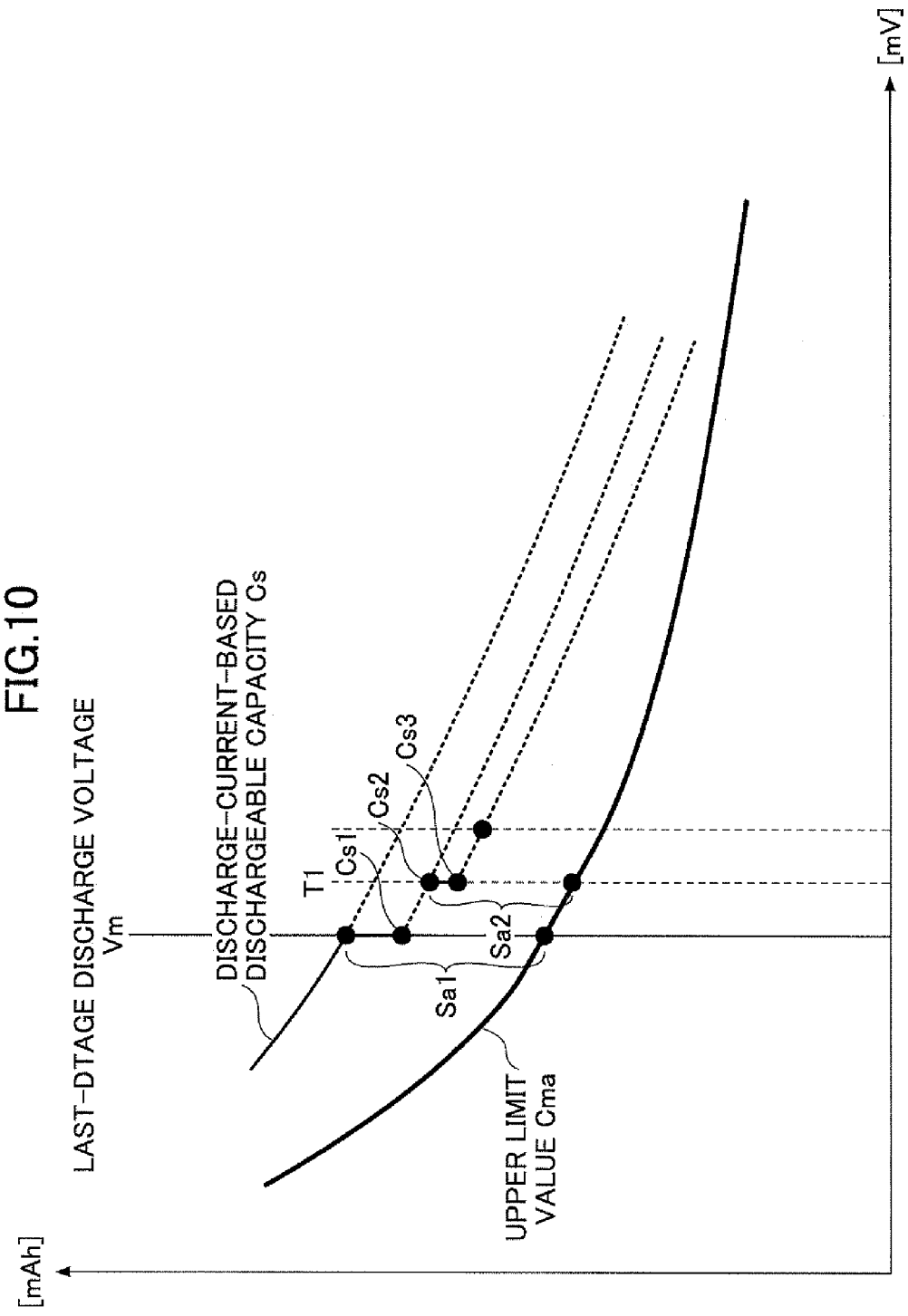
FIG. 10 is a graph illustrating a second method of correcting the discharge-current-based dischargeable capacity so that the discharge-current-based dischargeable capacity is less than or equal to the upper limit value according to the embodiment of the present invention.

FIG. 10 is a graph illustrating a second method of correcting the discharge-current-based dischargeable capacity Cs so that the discharge-current-based dischargeable capacity Cs is less than or equal to the upper limit value Cma. The capacity correction part 270 of this embodiment calculates a difference between the discharge-current-based dischargeable capacity Cs and the upper limit value Cma if the discharge-current-based dischargeable capacity Cs is greater than the upper limit value Cma. Then, the capacity correction part 270 performs such a correction as to gradually reduce the value of the discharge-current-based dischargeable capacity Cs by the quotient of the difference divided by a predetermined number at a time. For example, if the discharge-current-based dischargeable capacity Cs exceeds the upper limit value Cma, letting the difference between the discharge-current-based dischargeable capacity Cs and the upper limit value Cma at this point be Sa1, the remainder of subtracting Sa1/16, which is the quotient of the difference Sa1 divided by 16, from the discharge-current-based dischargeable capacity Cs is determined as a corrected discharge-current-based dischargeable capacity Cs1.

If a discharge-current-based dischargeable capacity Cs2, which is the remainder of subtracting a discharged amount from the corrected discharge-current-based dischargeable capacity Cs1, is greater than the upper limit value Cma at the next time of measurement by the battery monitoring IC 120, T1, the capacity correction part 270 similarly calculates a difference Sa2 between the discharge-current-based dischargeable capacity Cs2 and the upper limit value Cma. Next, the capacity correction part 270 subtracts Sa2/16, which is the quotient of the difference Sa2 divided by 16, from the corrected discharge-current-based dischargeable capacity Cs2. Then, the capacity correction part 270 determines the value obtained as a result of the subtraction as a corrected discharge-current-based dischargeable capacity Cs3. The capacity correction part 270 of this embodiment performs this correction until the discharge-current-based dischargeable capacity Cs becomes less than or equal to the upper limit value Cma.

According to this embodiment, it is possible to bring the discharge-current-based dischargeable capacity Cs close to the upper limit value Cma by thus correcting the discharge-current-based dischargeable capacity Cs. The upper limit value Cma is the estimated dischargeable capacity Ct, and is determined so that the dischargeable capacity becomes zero when the voltage value of the battery unit 111 equals the discharge cutoff voltage Vt. Therefore, according to this embodiment, by correcting the discharge-current-based dischargeable capacity Cs so as to bring the discharge-current-based dischargeable capacity Cs close to the upper limit value Cma, it is possible to make the dischargeable capacity zero at the discharge cutoff voltage Vt, and to establish correspondence between the discharge cutoff voltage Vt and the value of the dischargeable capacity.

In the case illustrated in FIG. 10 according to this embodiment, the difference Sa1 and the difference Sa2 are described as being divided by 16, but are not limited to this division. In subtracting a capacity from the discharge-current-based dischargeable capacity Cs according to this embodiment, such a value as is not determined as a battery abnormality by the battery monitoring IC 120 may be subtracted from the discharge-current-based dischargeable capacity Cs. This is because if the dischargeable capacity decreases sharply in correcting the discharge-current-based dischargeable capacity Cs, the battery monitoring IC 120 may determine this as a battery abnormality. Therefore, it is desirable that the difference Sa1 and the difference Sat be divided into such values as are not determined as battery abnormalities.

Figure 11:
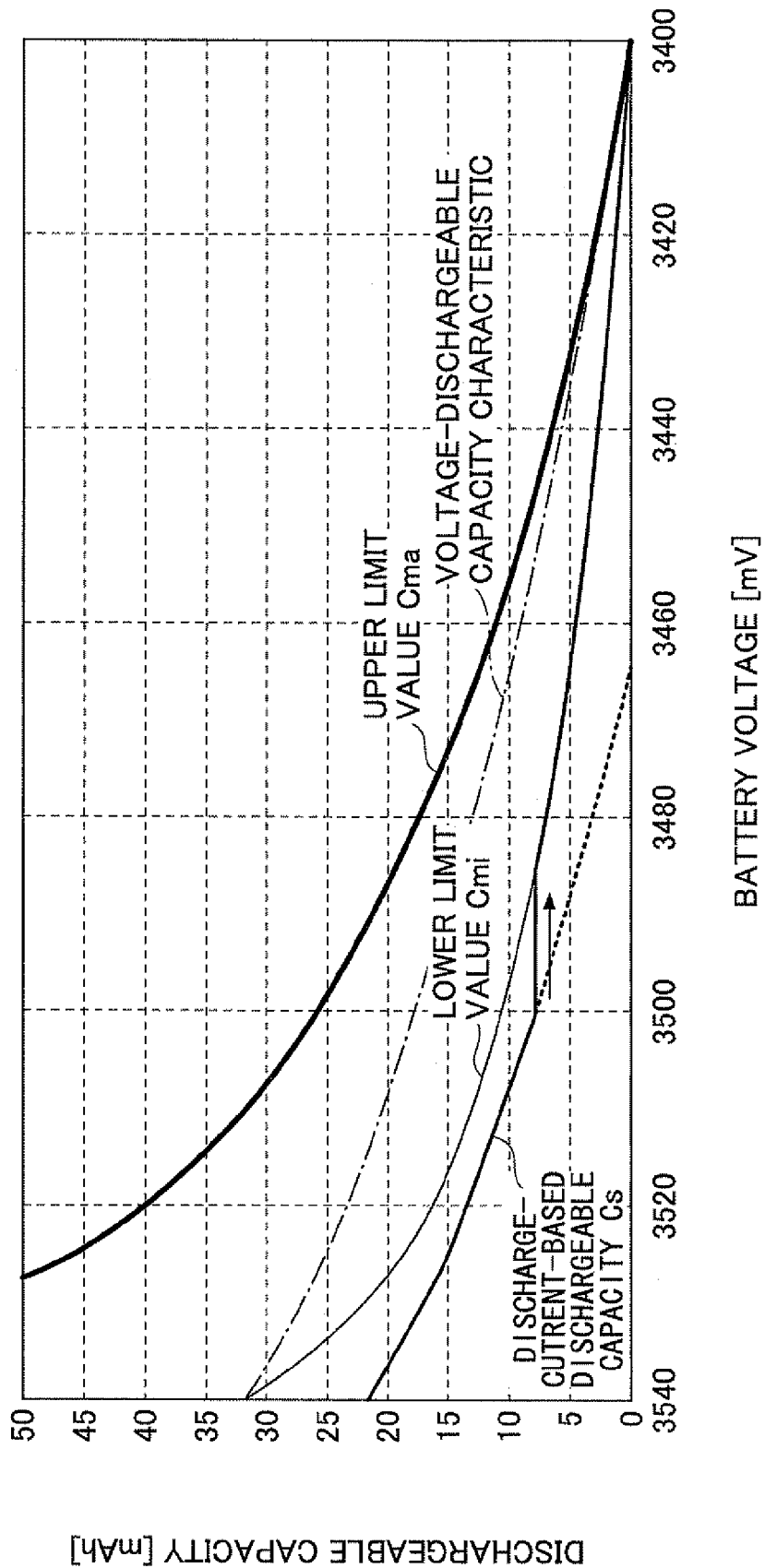
FIG. 11 is a graph illustrating a first method of correcting the discharge-current-based dischargeable capacity so that the discharge-current-based dischargeable capacity is more than or equal to a lower limit value according to the embodiment of the present invention.

Next, a description is given, with reference to FIG. 11 and FIG. 12, of correcting the discharge-current-based dischargeable capacity Cs so that the discharge-current-based dischargeable capacity Cs is more than or equal to the lower limit value Cmi. FIG. 11 is a graph illustrating a first method of correcting the discharge-current-based dischargeable capacity Cs so that the discharge-current-based dischargeable capacity Cs is more than or equal to the lower limit value Cmi.

As illustrated in FIG. 11, when the voltage value of the battery unit 111 reaches the last-stage discharge voltage Vm, the capacity correction part 270 of this embodiment corrects the discharge-current-based dischargeable capacity Cs so that the discharge-current-based dischargeable capacity Cs is more than or equal to the lower limit value Cmi if the discharge-current-based dischargeable capacity Cs is less than the lower limit value Cmi.

FIG. 12 is a graph illustrating a second method of correcting the discharge-current-based dischargeable capacity Cs so that the discharge-current-based dischargeable capacity Cs is more than or equal to the lower limit value Cmi. The capacity correction part 270 of this embodiment does not update the value of the discharge-current-based dischargeable capacity Cs to a value measured at the next time of measurement in the battery monitoring IC 120 if the discharge-current-based dischargeable capacity Cs is less than the lower limit value Cmi.

That is, if the discharge-current-based dischargeable capacity Cs is less than the lower limit value Cmi at the last-stage discharge voltage Vm, at the next measurement time T1, the capacity correction part 270 maintains the discharge-current-based dischargeable capacity Cs calculated at the previous measurement time as the value of the discharge-current-based dischargeable capacity Cs without updating the value of the discharge-current-based dischargeable capacity Cs to a discharge-current-based dischargeable capacity Cs3 calculated at the next measurement time T1. The capacity correction part 270 repeats this correction until the discharge-current-based dischargeable capacity Cs becomes more than or equal to the lower limit value Cmi. For example, if a discharge-current-based dischargeable capacity Cs4 calculated in a measurement time T2 is less than the lower limit value Cmi, the capacity correction part 270 determines not Cs4 but the discharge-current-based dischargeable capacity Cs of the previous measurement time T1 as the value of the discharge-current-based dischargeable capacity Cs.

According to the capacity correction part 270 of this embodiment, it is possible to bring the discharge-current-based dischargeable capacity Cs close to the lower limit value Cmi by thus correcting the discharge-current-based dischargeable capacity Cs. The lower limit value Cmi is determined so that the dischargeable capacity becomes zero when the voltage value of the battery unit 111 equals the discharge cutoff voltage Vt. Therefore, according to this embodiment, by correcting the discharge-current-based dischargeable capacity Cs so as to bring the discharge-current-based dischargeable capacity Cs close to the lower limit value Cmi, it is possible to make the dischargeable capacity zero at the discharge cutoff voltage Vt, and to establish correspondence between the discharge cutoff voltage Vt and the value of the dischargeable capacity.

Further, according to this embodiment, it is possible to make the discharge-current-based dischargeable capacity Cs greater than or equal to the lower limit value Cmi without increasing the value of the discharge-current-based dischargeable capacity Cs. Therefore, according to this embodiment, it is possible to prevent the battery monitoring IC 120 from being caused, by increasing a decreasing discharge-current-based dischargeable capacity Cs, to make an erroneous battery abnormality determination.

Therefore, according to this embodiment, it is possible to reduce an error in the dischargeable capacity of the battery unit 111 at the last stage of discharging and to improve the accuracy of detecting the dischargeable capacity of the battery unit 111.

Thus, according to one aspect of the present invention, a battery pack, a semiconductor integrated circuit, a remaining capacity correction method, and a computer-readable storage medium storing a program for causing a computer to execute this remaining capacity correction method are provided that reduce an error in the dischargeable capacity of a rechargeable battery at the last stage of discharging and to improve the accuracy of detecting the dischargeable capacity of the rechargeable battery.

According to one aspect of the present invention, by way of example, the battery pack 100 includes the voltage sensor circuit 122b (a voltage detection part) configured to detect the voltage of the battery unit 111 including the chargeable and dischargeable secondary cells 110; the current sensor circuit 122c (a current detection part) configured to detect a current flowing through the battery unit 111; the dischargeable capacity calculation part 260 configured to calculate the dischargeable capacity Cs of the battery unit 111 based on the current detected by the current sensor circuit 122c; and the capacity correction part 270 configured to correct the remaining capacity Cz of the battery unit 111, the remaining capacity Cz including the dischargeable capacity Cs calculated by the dischargeable capacity calculation part 260, wherein the capacity correction part 270 is configured to correct the remaining capacity Cz based on the estimated dischargeable capacity Ct calculated from the relationship between the discharge cutoff voltage Vt (a preset predetermined voltage) and the drop rate of the voltage of the battery unit 111, in response to the voltage of the battery unit 111 becoming less than or equal to the last-stage discharge voltage Vm (a predetermined threshold).

According to one aspect of the present invention, by way of example, a method of correcting the remaining capacity Cz of the battery unit 111 by the battery pack 100 including the battery unit 111, the battery unit 111 including the chargeable and dischargeable secondary cells 100, includes the steps of detecting a current flowing through the battery unit 111 (step S801); detecting a voltage of the battery unit 111 (step S801); calculating the dischargeable capacity Cs of the battery unit 111 based on the current detected by the step of detecting the current; and correcting the remaining capacity Cz of the battery unit 111, the remaining capacity Cz including the dischargeable capacity Cs calculated by the step of calculating the dischargeable capacity Cs (steps S810 and S812), wherein the step of correcting the remaining capacity Cz corrects the remaining capacity Cz based on the estimated dischargeable capacity Ct calculated from the relationship between the discharge cutoff voltage Vt (a preset predetermined voltage) and the drop rate of the voltage of the battery unit 111, in response to the voltage of the battery unit 111 becoming less than or equal to the last-stage discharge voltage Vm (a predetermined threshold).

According to one aspect of the present invention, by way of example, the ROM 123 (a computer-readable storage medium) stores a program for causing the central processing unit 121 (a computer) to execute a method of correcting the remaining capacity Cz of a battery unit 111 in a battery pack 100 including the battery unit 111, the battery unit 111 including the chargeable and dischargeable secondary cells 110, the method including the steps of detecting a current flowing through the battery unit 111 (step S801); detecting a voltage of the battery unit 111 (step S801); calculating the dischargeable capacity Cs of the battery unit 111 based on the current detected by the step of detecting the current; and correcting the remaining capacity Cz of the battery unit 111, the remaining capacity Cz including the dischargeable capacity Cs calculated by the step of calculating the dischargeable capacity Cs (steps S810 and S812), wherein the step of correcting the remaining capacity Cz corrects the remaining capacity Cz based on the estimated dischargeable capacity Ct calculated from the relationship between the discharge cutoff voltage Vt (a preset predetermined voltage) and the drop rate of the voltage of the battery unit 111, in response to the voltage of the battery unit 111 becoming less than or equal to the last-stage discharge voltage Vm (a predetermined threshold).

According to one aspect of the present invention, by way of example, the battery monitoring IC 120 (a semiconductor integrated circuit) includes the voltage sensor circuit 122b (a voltage detection part) configured to detect the voltage of the battery unit 111 including the chargeable and dischargeable secondary cells 110; the current sensor circuit 122c (a current detection part) configured to detect a current flowing through the battery unit 111; the dischargeable capacity calculation part 260 configured to calculate the dischargeable capacity Cs of the battery unit 111 based on the current detected by the current sensor circuit 122c; and the capacity correction part 270 configured to correct the remaining capacity Cz of the battery unit 111, the remaining capacity Cz including the dischargeable capacity Cs calculated by the dischargeable capacity calculation part 260, wherein the capacity correction part 270 is configured to correct the remaining capacity Cz based on the estimated dischargeable capacity Ct calculated from the relationship between the discharge cutoff voltage Vt (a preset predetermined voltage) and the drop rate of the voltage of the battery unit 111, in response to the voltage of the battery unit 111 becoming less than or equal to the last-stage discharge voltage Vm (a predetermined threshold).

The present invention is not limited to the specifically disclosed embodiment, and variations and modifications may be made without departing from the scope of the present invention.

The present application is based on and claims the benefit of priority of Japanese Patent Application No. 2009-006087, filed on Jan. 14, 2009, the entire contents of which are incorporated herein by reference.

DESCRIPTION OF THE REFERENCE NUMERALS 100 battery pack
110 rechargeable battery
111 battery unit
120 battery monitoring IC
130 protection IC
210 current value obtaining part
220 voltage value obtaining part
230 timer part
240 storage control part
250 communication part
260 dischargeable capacity calculation part
270 capacity correction part
271 discharge cutoff voltage reference part
272 last-stage discharge voltage reference part
273 voltage drop rate calculation part
274 estimated dischargeable capacity calculation part
275 upper limit value setting part
276 lower limit value setting part
277 capacity comparison part

The invention claimed is:

1. A battery pack, comprising:
a voltage detection part configured to detect a voltage of a battery unit including a plurality of chargeable and dischargeable secondary cells;
a current detection part configured to detect a current flowing through the battery unit;
a dischargeable capacity calculation part configured to calculate a dischargeable capacity of the battery unit based on the current detected by the current detection part; and
a capacity correction part configured to correct a remaining capacity of the battery unit, the remaining capacity including the dischargeable capacity calculated by the dischargeable capacity calculation part,
wherein the capacity correction part is configured to correct the remaining capacity based on an estimated dischargeable capacity calculated from a relationship between a preset predetermined voltage and a drop rate of the voltage of the battery unit, in response to the voltage of the battery unit becoming less than or equal to a predetermined threshold.

2. The battery pack as claimed in claim 1, wherein the capacity correction part is configured to correct the remaining capacity of the battery unit by correcting the dischargeable capacity included in the remaining capacity based on the estimated dischargeable capacity.

3. The battery pack as claimed in claim 1, wherein the capacity correction part comprises:
a drop rate calculation part configured to calculate the drop rate of the voltage of the battery unit; and
an estimated dischargeable capacity calculation part configured to calculate the estimated dischargeable capacity based on the drop rate of the voltage and a preset discharge cutoff voltage.

4. The battery pack as claimed in claim 3, wherein the capacity correction part further comprises:
a setting part configured to set the estimated dischargeable capacity calculated by the estimated dischargeable capacity calculation part as an upper limit value of the dischargeable capacity and to set a product of the estimated dischargeable capacity and a predetermined value as a lower limit value of the dischargeable capacity, and
the capacity correction part is configured to correct the dischargeable capacity so that a value of the dischargeable capacity is between the upper limit value and the lower limit value set by the setting part.

5. The battery pack as claimed in claim 4, wherein the capacity correction part is configured to correct the dischargeable capacity by gradually reducing the dischargeable capacity by a predetermined capacity at a time until the dischargeable capacity is less than or equal to the estimated dischargeable capacity, if the dischargeable capacity is greater than the upper limit value.

6. The battery pack as claimed in claim 4, wherein the capacity correction part is configured to prevent the dischargeable capacity from being updated before the dischargeable capacity becomes greater than or equal to the estimated dischargeable capacity, if the dischargeable capacity is less than the lower limit value.

7. A method of correcting a remaining capacity of a battery unit by a battery pack including the battery unit, the battery unit including a plurality of chargeable and dischargeable secondary cells, the method comprising the steps of:
detecting a current flowing through the battery unit;
detecting a voltage of the battery unit;
calculating a dischargeable capacity of the battery unit based on the current detected by said step of detecting the current; and
correcting a remaining capacity of the battery unit, the remaining capacity including the dischargeable capacity calculated by said step of calculating the dischargeable capacity,
wherein said step of correcting the remaining capacity corrects the remaining capacity based on an estimated dischargeable capacity calculated from a relationship between a preset predetermined voltage and a drop rate of the voltage of the battery unit, in response to the voltage of the battery unit becoming less than or equal to a predetermined threshold.

8. A computer-readable storage medium storing a program for causing a computer to execute the method of correcting a remaining capacity of a battery unit as set forth in claim 7.

9. A semiconductor integrated circuit, comprising:
a voltage detection part configured to detect a voltage of a battery unit including a plurality of chargeable and dischargeable secondary cells;
a current detection part configured to detect a current flowing through the battery unit;
a dischargeable capacity calculation part configured to calculate a dischargeable capacity of the battery unit based on the current detected by the current detection part; and
a capacity correction part configured to correct a remaining capacity of the battery unit, the remaining capacity including the dischargeable capacity calculated by the dischargeable capacity calculation part,
wherein the capacity correction part is configured to correct the remaining capacity based on an estimated dischargeable capacity calculated from a relationship between a preset predetermined voltage and a drop rate of the voltage of the battery unit, in response to the voltage of the battery unit becoming less than or equal to a predetermined threshold.

* * * * *